United States Patent [19]

Chen et al.

[11] Patent Number: 4,471,367
[45] Date of Patent: Sep. 11, 1984

[54] MESFET USING A SHALLOW JUNCTION GATE STRUCTURE ON GAINAS

[75] Inventors: Chung Y. Chen, Scotch Plains; Alfred Y. Cho, Summit, both of N.J.

[73] Assignee: AT&T Bell Laboratories, Murray Hill, N.J.

[21] Appl. No.: 327,551

[22] Filed: Dec. 4, 1981

[51] Int. Cl.³ .................. H01L 29/80; H01L 29/56
[52] U.S. Cl. ................................. 357/22; 357/15; 357/16
[58] Field of Search .................. 357/22, 15, 86, 16

[56] References Cited

U.S. PATENT DOCUMENTS

| | | | |
|---|---|---|---|
| 3,943,552 | 3/1976 | Shannon et al. | 357/15 |
| 4,075,651 | 2/1978 | James | 357/15 X |
| 4,350,993 | 9/1982 | Wieder | 357/15 X |
| 4,424,525 | 1/1984 | Mimura | 357/16 |

OTHER PUBLICATIONS

Hasegawa et al., "Microwave Field Effect Transistors" *IEEE Int. Solid State Circuits Conf.,* San Francisco, pp. 118-119, Feb. 1978.
Matsushima et al., "Dark Current of In$_{0.53}$Ga$_{0.47}$As/Inp Mesa Type Avalanche Transistors", *Jpn. J. Appl. Phys.,* vol. 19, No. 3, pp. 573-574, Mar. 1980.
Shannon, J. M., "Control of Schottky Barrier Height Using Highly Doped Surface Layers", *Solid State Electronics,* vol. 19, No. 6, pp. 537-543, Jun. 1976.
Statz, H., "Fabricating Field Effect Transistors", *IBM Tech. Disc. Bull.* vol. 11, No. 4, p. 397, Sep. 1968.
Leheny et al., "An In$_{0.53}$Ga$_{0.47}$As Junction FET" *IEEE Electron Device Lett.,* vol. EDL-1, No. 6, pp. 110-111, Jun. 1980.
K. Kajiyama, et al., "Schottky Barrier Height of n—In$_x$Ga$_{1-x}$As Diodes," *Applied Physics Letters,* vol. 23, No. 8, Oct. 15, 1973, pp. 458-459.
D. V. Morgan, et al., "Increasing the Effective Barrier Height of Schottky Contacts to n—In$_x$Ga$_{1-x}$As," *Electronics Letters,* vol. 14, Nov. 9, 1978, pp. 737-738.
H. Ohno, et al., "Double Heterostructure Ga$_{0.47}$In$_{0.53}$As MESFETS by MBE," *IEEE Electron Device Letters,* vol. EDL-1, No. 8, Aug. 1980, pp. 154-155.
H. K. Bucher, et al., "Photodetection by Barrier Modulation in Cu–Diffused Au/CdS Junctions," *Applied Physics Letters,* vol. 23, No. 11, Dec. 1, 1973, pp. 617-619.
J. M. Shannon, "Increasing the Effective Height of a Schottky Barrier Using Low-Energy Ion Implantation," *Applied Physics Letters,* vol. 25, No. 1, Jul. 1, 1974, pp. 75-77.
A. Y. Cho, et al., "Molecular Beam Epitaxy," *Progress in Solid-State Chemistry,* vol. 10, Part 3, pp. 157-191.

*Primary Examiner*—William D. Larkins
*Attorney, Agent, or Firm*—Richard D. Laumann

[57] ABSTRACT

A thin and highly doped Ga$_{0.47}$In$_{0.53}$As layer disposed on a Ga$_{0.47}$In$_{0.53}$As layer increases the barrier height and produces useful device characteristics. For example, the structure may be used as the gate electrode in an InGaAs field effect transistor.

5 Claims, 4 Drawing Figures

MESFET USING A SHALLOW JUNCTION GATE STRUCTURE ON GAINAS

TECHNICAL FIELD

This invention generally relates to devices having shallow junction gate structures and particularly to GaInAs devices with such structures.

BACKGROUND OF THE INVENTION

Although many materials have been considered for use in modern day semiconductor devices, silicon is presently used in the overwhelming majority of such devices. This is true even though other materials, such as Group III-V compound semiconductors, are potentially more promising than silicon for certain applications such as high speed field effect transistors. One Group III-V material, GaAs, has been rather extensively investigated for field effect transistor applications because such devices fabricated from this material are potentially faster than are silicon devices due to the higher drift mobility for electrons in GaAs.

Other materials, for example, $Ga_{0.47}In_{0.53}As$, are potentially more attractive FET applications than GaAs because they have still higher low electric field mobilities and can be grown lattice matched to InP substrates. This composition, as well as others containing phosphorus, is also of interest because it can be epitaxially grown lattice matched to InP substrates. However, the development of InGaAs field effect transistors has not progressed to the stage of development of GaAs FETs and of commercial devices at least partially because of the lack of a suitable gate structure. It is reported in, for example, *Applied Physics Letters*, 23, pp. 458–459, Oct. 15, 1973, a plain $Au/Ga_{0.47}In_{0.53}As$ contact has a barrier height of approximately 0.2 volts and this height is too low for useful field effect transistor applications.

Several approaches have been taken in attempts to overcome the lack of suitable gate structure. Leheny et al. reported in *IEEE Electron Device Letters*, 1, pp. 110–111, June, 1980, an InGaAs junction field effect transistor with a p-n junction gate fabricated by Zn diffusion. While this device did have the advantage of a reduced gate leakage current because of the reverse biased p-n junction, such devices were not easily fabricated with short channel lengths. Morgan et al. reported in *Electronics Letters*, 14, pp. 737–738, Nov. 9, 1978, an InGaAs Schottky diode with barrier height of approximately 0.5 volts with the increase being due to the presence of a thin $SiO_x$ layer. While the presence of the $SiO_x$ layer did increase the apparent barrier height, it was undesirable because of the presence of a large number of trapping levels which could lead to charge storage effects. Additionally, GaInAs FETs using a semi-insulating $Al_{0.48}In_{0.58}As$ layer to raise the Schottky barrier height were reported by Ohno et al. in *IEEE Electron Device Letters*, 1, pp. 154–155, August, 1980. The minimum thickness for the AlInAs layer that was required to prevent a substantial tunneling current was reported to be 200 Angstroms. This leads to an appreciable voltage drop across the insulating layer.

There are other reports in the literature of attempts to raise Schottky barrier heights on materials other than GaInAs. For example, Bucher, et al. reported in *Applied Physics Letters*, 23, pp. 617–619, Dec. 1, 1973 that Cu-diffused Au/CdS junctions had an increased Schottky barrier height. Shannon reported in *Applied Physics Letters*, 25, pp. 75–77, July 1, 1974, that the Schottky barrier height of Ni—Si diodes was increased by using ion implantation to create a shallow n-type layer on an underlying p-type layer.

SUMMARY OF THE INVENTION

We have found that a thin and highly doped first InGaAs layer having a first conductivity type and disposed on a second InGaAs layer having a second conductivity type raises the effective Schottky barrier height of the second InGaAs layer. In one preferred embodiment, the layer is fully depleted and comprises p-type $Ga_{0.47}In_{0.53}As$ disposed on an n-type $Ga_{0.47}In_{0.53}As$ layer. Both layers are grown on an InP substrate. In a further preferred embodiment, the resulting structure is used in field effect transistor devices.

DETAILED DESCRIPTION

Figure 1:
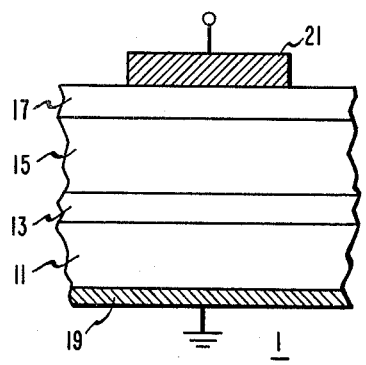
FIG. 1 is a schematic diagram of a diode according to this invention which has an increased Schottky barrier height.

An InGaAs diode having an increased Schottky barrier height according to this invention is shown in sectional view in FIG. 1. For reasons of clarity, the elements of the device are not drawn to scale in this as well as the other FIGURES. The device, indicated generally as 1, comprises an InP substrate 11 having a first conductivity type, a first epitaxial InGaAs layer 13 having a first conductivity type, a second InGaAs epitaxial layer 15 having a first conductivity type, and a third InGaAs epitaxial layer 17 having a second conductivity type. Although the layers are referred to as InGaAs layers, it is to be understood that these layers may contain other elements, such as phosphorus, provided that the resulting layer is lattice matched to the InP substrate. It further comprises ohmic contact 19 and Schottky contact 21 which are made to layers 11 and 17, respectively. In one preferred embodiment, the second conductivity type is p-type and layer 17 has a thickness and doping concentration so that it is completely depleted at thermal equilibrium and raises the effective Schottky barrier height of layer 15. Layers that are too thin are undesirable because of the increased tunneling current.

In one embodiment, the substrate is an n+ (100) oriented InP substrate. Layer 13 is an n+ $Ga_{0.47}In_{0.53}As$ layer having a thickness of 0.5 μm and a doping concentration of $2 \times 10^{18}$ cm$^{-3}$ which is grown to avoid the possibility of forming a blocking junction at the substrate interface. This layer may be omitted if desired. Layer 15 is n-type $Ga_{0.47}In_{0.53}As$ with a thickness of 3 μm and a doping concentration of $1.1 \times 10^{17}$ cm$^{-3}$. Layer 17 is p+ $Ga_{0.47}In_{0.53}As$ and has a thickness of approximately 80 Angstroms and a doping concentration of $8 \times 10^{18}$ cm$^{-3}$. The n-type dopant may be Sn or Si and the p-type dopant may be Be or Mg. Ohmic contact 19 is formed by electroplating Sn—Au to the substrate and sintering at 450° C. for approximately 20 seconds. Schottky contact 21 is a circular Au dot which is deposited to the surface.

The device depicted is conveniently fabricated by well-known molecular beam epitaxy techniques such as those described in the article in *Progress in Solid State Chemistry*, 10, p. 157, 1975, authored by A. Y. Cho and J. R. Arthur. The layer thicknesses and doping concentrations are exemplary and may be modified. Layer 17 desirably has a thickness between approximately 70 and 1000 Angstroms. Other modifications are contemplated. For example, Al may be used instead of Au to form a Schottky contact.

Figure 2:
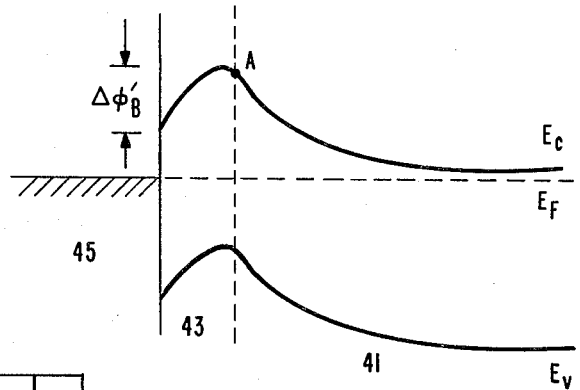
FIG. 2 is the energy band diagram at thermal equilibrium of a Schottky barrier diode according to this invention.

To obtain the maximum increase in barrier height, the device parameters are selected in such a way that the p+ layer is fully depleted at thermal equilibrium. The energy band diagram of this quasi-Schottky barrier diode having a thin and fully depleted layer is shown in FIG. 2. Region 41 is the n-type layer, region 43 is the p+-type layer and region 45 is the metal. $E_c$, $E_f$, and $E_v$ refer to the conduction band, Fermic level and valence band, respectively. The diagram may be obtained by solving Poisson's equation. The enhancement of the barrier height, indicated as $\Delta\phi_B'$, for the majority electrons is evident. It should be noted that the depletion of the p+ layer is partly due to the p+-n junction and partly to the Au/p+ contact. A detailed analysis may be made which shows the latter makes a greater contribution than the former. Consequently, the peak of the potential energy is located inside the p+ layer but is close to the p+-n metallurgical junction. The inflection point in the energy band diagram indicated as A, is precisely the location of the p+-n junction.

Figure 3:
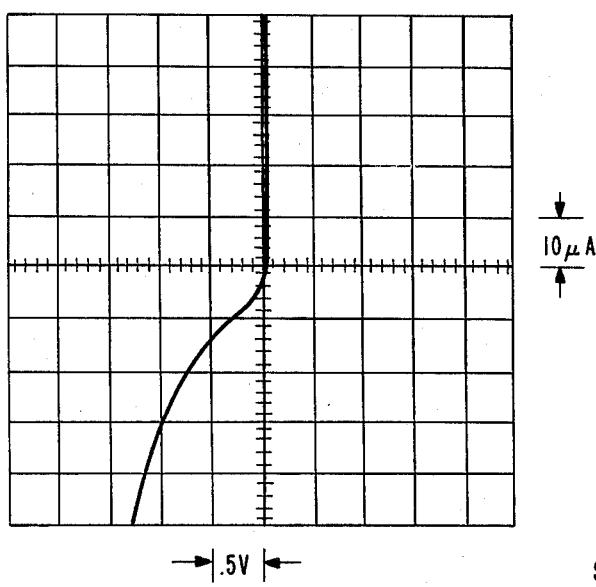
FIG. 3 is the current voltage characteristic of a typical Schottky barrier diode of this invention.

FIG. 3 shows a typical current voltage characteristic of a Schottky barrier diode having a p+ layer thickness of approximately 80 Angstroms of this invention with the voltage plotted horizontally versus the current plotted vertically. The device had a diameter of 300 μm and the reverse leakage current was about 30 μA at 1 volt and 115 μA at 1.5 volts. This corresponds to a reverse leakage current of 85 nA and 0.33 μA at 1 volt and 1.5 volts, respectively, for a 1×200 μm gate. Leakage currents of this size are comparable to that of the oxide enhanced Schottky diode. The reverse leakage current was found to increase exponentially with the applied voltage and this was shown to be caused by tunneling.

The effective barrier height of a Schottky barrier diode can be calculated from equation (1):

$$\phi_B' = (kT/q) \ln (A^* T^2 / J_s) \quad (1)$$

where $A^*$ is the Richardson constant and $J_s$ the reverse leakage current density. If it is assumed that the electron effective mass is $0.041 m_e$, $A^* = 4.92$ A/cm²/k², the effective barrier height is 0.47 volts. Theoretically, the enhancement of the Schottky barrier height $\Delta\phi_B'$ due to the p+ surface layer is given approximately by equation (2):

$$\Delta\phi_B' \approx \frac{qN_A d^2}{2\epsilon_s} \quad (2)$$

where $\epsilon_s$ is the permittivity of the $Ga_{0.47}In_{0.53}As$ layer, $N_A$ is the doping level in the p+ layer, and d is the thickness of the p+ layer. Although it can be shown that equation (2) holds only when equation (3):

$$\Delta\phi_B' >> \frac{V_{bi}N_D}{N_A} \quad (3)$$

where $N_D$ is the doping level of the n-type layer and $V_{bi}$ is the built-in potential of the p+-n junction is valid, the thickness and doping level in the described structure satisfy this condition. Therefore, the Schottky barrier enhancement is calculated to be 0.3 volts making a total effective barrier height of 0.5 volts, which agrees reasonably well with the calculated result from equation (1).

The forward I-V characteristics shown in FIG. 3 fit reasonably well the standard current equation for a Schottky barrier diode with an ideality factor of 1.3. This nonunity ideality factor indicates a strong voltage dependence of the effective barrier height. This is not surprising considering that the applied voltage being dropped across the depleted p+ layer and the depletion region in the n-type layer. While a nonunity ideality factor of a Schottky barrier can generate excessive shot noise for a mixer diode application, it is not terribly important for a MESFET application. Other device applications include, for example, IMPATT diodes as well as other Schottky barrier devices. If it is assumed that the cut-in voltage, for example, is the forward bias voltage required to reach a current of, for example, 10 μa, then the Schottky barrier diode has a cut-in voltage of 0.005 volts.

The free hole concentration in the p+ layer was estimated to be approximately $1.6 \times 10^{14}$ cm$^{-3}$ in view of the separation between the Fermi level and the maximum of the valence band. This number is negligibly small compared to $N_A$ and satisfies the condition of depletion, namely, p is much less than $N_A$ where p is the free hole concentration.

A device was fabricated according to FIG. 1 with the same doping concentrations and layer thicknesses except that layer 17 was 700 Angstroms thick. A $Ga_{0.47}In_{0.53}As$ p-n junction diode of the same area as the device previously described had a cut-in voltage of 0.14 volts and a reverse leakage current of 1 mA at a bias of 2 volts.

The capacitance-voltage characteristic of the diode was also obtained. Measurements of the C-V characteristic at 1 MHz showed no hysteresis. A $C^{-2}$ versus voltage plot suggested a uniform carrier concentration of $1.2 \times 10^{17}$ cm$^{-3}$ in the n-type layer and a barrier height of approximately 0.51 volts. These measurements were in good agreement with the Hall measurement and I-V measurement, respectively.

Figure 4:
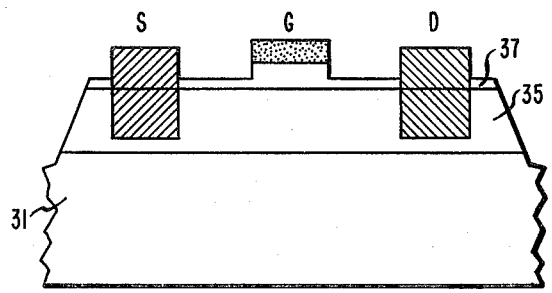
FIG. 4 is a schematic diagram of a field effect transistor according to this invention.

The device depicted in FIG. 1 and modifications thereof may be used by itself or may be further modified or incorporated into other devices such as the field effect transistor depicted in sectional view in FIG. 4. This device generally incorporates the device depicted in FIG. 1 except for layer 13 which was omitted and for the substrate which is now semi-insulating. Contact 21 is designated G and ohmic contact 19, i.e., the substrate contact, is omitted. Layer 35 comprises n-type $In_{0.53}Ga_{0.47}As$ and layer 37 comprises p+-type $In_{0.53}Ga_{0.47}As$. The device further comprises source (first) and drain (second) electrodes which are designated as S and D, respectively. The device is conveniently fabricated by well-known molecular beam epitaxy techniques. The electrodes are conveniently fabricated by depositing the conventional Au-Ge-Au alloy to the p-type InGaAs surface and alloy for a time of approximately 30 seconds at a temperature of approximately 440 degrees C. The alloy penetrates the p+ layer and stops in the n-type layer. Measurements showed that the source and drain electrodes became ohmic after sintering.

The p+ layer, as initially formed, is less than approximately 1000 Angstroms thick and thick enough to prevent a substantial tunneling current. Thicker layers are undesirable because of difficulty in making electrical contact to layer 35. Layer 37 is etched after the ohmic contacts have been formed to obtain a thickness between the gate electrodes and the source and drain electrodes of less than approximately 150 Angstroms. The metal contacts thus serve as masks for the etching process. The etching may be performed with conventional etching techniques. It is not necessary to completely remove the p+ layer because a portion of layer 37 under the gate electrode is completely depleted. The etching may be omitted if the thickness of the p+ layer, as initially formed, is less than 150 Angstroms.

Although normally ON devices are depicted, a normally OFF device may also be fabricated by varying, in well-known manner, the thickness of layer 37. Additionally, although an n-channel FET has been described, p-channel FETs may be fabricated by making layer 37 n-type and layer 35 p-type.

What is claimed is:

1. A semiconductor device comprising a InP substrate, and disposed on said substrate a first epitaxial layer comprising InGaAs having a N conductivity type, a second epitaxial layer comprising InGaAs having a P conductivity type, said second layer having a thickness between approximately 70 and 1000 Angstroms, a first electrical contact to said second layer; second and third electrical contacts to said first epitaxial layer deposited on and extending through said second layer, said first electrical contact being intermediate said second and said third electrical contacts.

2. A device as recited in claim 1 further comprising an electrical contact to said substrate.

3. A device as recited in claim 2 in which said second epitaxial layer is essentially completely depleted at thermal equilibrium.

4. A device as recited in claim 3 in which said second layer has a thickness less than 150 Angstroms.

5. A device as recited in claim 1 in which said second epitaxial layer intermediate said first and second electrical contacts has a thickness less than 150 Angstroms.

* * * * *